(12) United States Patent
Habenicht et al.

(10) Patent No.: US 8,062,974 B2
(45) Date of Patent: Nov. 22, 2011

(54) SEMICONDUCTOR DEVICE WITH GROUNDING STRUCTURE

(75) Inventors: Soenke Habenicht, Hamburg (DE);
Ansgar Thorns, Hamberg (DE);
Heinrich Zeile, Hamburg (DE)

(73) Assignee: NXP B.V., Eindhoven (NL)

( * ) Notice: Subject to any disclaimer, the term of this patent is extended or adjusted under 35 U.S.C. 154(b) by 597 days.

(21) Appl. No.: 11/997,240

(22) PCT Filed: Jul. 31, 2006

(86) PCT No.: PCT/IB2006/352607
§ 371 (c)(1),
(2), (4) Date: Jan. 29, 2008

(87) PCT Pub. No.: WO2007/017786
PCT Pub. Date: Feb. 15, 2007

(65) Prior Publication Data
US 2008/0217785 A1   Sep. 11, 2008

(30) Foreign Application Priority Data

Aug. 9, 2005  (EP) ..................................... 05107307

(51) Int. Cl.
*H01L 21/4763* (2006.01)
*H01L 21/44* (2006.01)
*H01L 23/48* (2006.01)
*H01L 23/52* (2006.01)
*H01L 29/40* (2006.01)

(52) U.S. Cl. ........ 438/666; 438/622; 257/750; 257/758; 257/760; 257/E23.153; 257/E21.575; 257/773

(58) Field of Classification Search .................. 438/622, 438/666; 257/750, 758, 760, E23.153, E21.575
See application file for complete search history.

(56) References Cited

U.S. PATENT DOCUMENTS

| 5,763,936 A | 6/1998 | Yamaha et al. |
| 5,880,529 A | 3/1999 | Barrow |
| 7,067,902 B2 * | 6/2006 | Hichri et al. ................... 257/621 |
| 2005/0118803 A1 | 6/2005 | Hichri et al. |

FOREIGN PATENT DOCUMENTS

| EP | 0924762 A2 | 6/1999 |
| JP | 2001053148 A | 2/2001 |

* cited by examiner

*Primary Examiner* — David Zarneke

(57) ABSTRACT

Conductions and vias between different, stacked metallic layers of a semiconductor device may be mechanically damaged by mechanical strain. According to an exemplary embodiment of the present invention, this mechanical strain may be transferred through the layer structure to the substrate by a grid of grounding structures and isolation and passivation layers which are connected by the grounding structures. This may provide for an enhancement of the lifetime of the semiconductor devices.

19 Claims, 4 Drawing Sheets

SEMICONDUCTOR DEVICE WITH GROUNDING STRUCTURE

The present invention relates to the field of semiconductor devices. In particular, the present invention relates to a supporting structure for supporting an isolation and passivation layer in a semiconductor device, a semiconductor device with a supporting structure and to a method of supporting an isolation and passivation layer in a semiconductor device.

Conductions/vias between different, stacked metallic layers of a semiconductor device, separated by an isolation and passivation layer, and in particular bond pads are preferred places for cracks in the isolation and passivation layers because of an insertion of mechanical stress into the layer structure induced by a plastic moulding on top of the device. The mechanical stress, which may lead to significant shear forces, may result in a mechanical shift of different layers with respect to each other, or to a generation of cracks, a short circuit, or other damage, defect, failure or even destruction of the device.

It may be desirable to have an improved support for isolation and passivation layers in a semiconductor device.

According to an exemplary embodiment of the present invention, a supporting structure for supporting an isolation and passivation layer in a semiconductor device may be provided, the supporting structure comprising a first grounding structure adapted for connecting a first layer of the semiconductor device via a metal layer to a lower second layer of the semiconductor device.

Therefore, according to this exemplary embodiment of the present invention, a support for isolation and passivation layers may be provided, which may reduce the stress induction into the first layer and therefore may lower the risk of cracks in the layer structure. Therefore, the supporting structure, which comprises a first grounding structure, connects the upper first layer through the sandwiched metal layer to the lower second layer. This may reduce the impact of stress induction into the semiconductor surface, e.g. in the vicinity of conductions and bond pads, and may help to enhance the lifetime of the semiconductor device.

According to another exemplary embodiment of the present invention, the first layer is a first isolation and passivation layer and the second layer is a second isolation and passivation layer or a substrate.

Thus, the grounding structure may mechanically couple an upper isolation and passivation layer to a lower isolation and passivation layer or even to the substrate. In any case, a metal layer is arranged between the two isolation and passivation layers or between the upper isolation and passivation layer and the substrate. This may result in a mechanical fixation of the upper isolation and passivation layer to a lower lying basis.

According to another exemplary embodiment of the present invention, the first grounding structure comprises a material with a first hardness and the metal layer comprises a material with a second hardness, wherein the first hardness is significantly bigger than the second hardness.

This may provide for a supporting structure which is much more stable and harder than the neighbouring conductive layers.

According to another exemplary embodiment of the present invention, the first grounding structure is mechanically hard and stable and comprises a material selected from the group consisting of thermal oxide, silicon dioxide, silicon nitride, and titanium.

Therefore, according to this exemplary embodiment of the present invention, the supporting structure may have good stabilizing properties. Furthermore, the thermal oxide or silicon dioxide may be grown directly on the substrate by an oxidization process. This may provide for an easy fabrication.

According to another exemplary embodiment of the present invention, the semiconductor device comprises at least one of a metallic via and a bond pad, wherein the first grounding structure is arranged in an edge section of the metallic via or in an edge section of the bond pad.

By positioning the grounding structure in the vicinity of a bond pad or close to a metallic via, the lifespan of the semiconductor device may be increased, since the isolation and passivation layers in the vicinity of metallization regions, such as bond pads, or electrical connections between different metal layers (vias) are often subject to mechanical strain.

According to another exemplary embodiment of the present invention, the supporting structure further comprises a second grounding structure adapted for connecting the first layer of the semiconductor device via the metal layer to the lower second layer of the semiconductor device, wherein the first grounding structure and the second grounding structure are arranged along a direction of a thermo mechanical strain induced by a plastic moulding on top of the device.

Thus, a plurality of grounding structures may be provided which may be arranged in such a way, that mechanical strain, such as shear forces induced by a temperature gradient or by different expansion coefficients of different layers, are efficiently absorbed or damped by the supporting structure.

According to another exemplary embodiment of the present invention, the supporting structure further comprises a third grounding structure adapted for connecting one of the first layer or the second layer to a lower third layer of the semiconductor device, wherein the third layer of the semiconductor device is part of the substrate.

Therefore, according to this exemplary embodiment of the present invention, a plurality of grounding structures is provided, which may connect a plurality of isolation and passivation layers until the substrate is reached. Thus, the upper isolation and passivation layer may be connected to a lower isolation and passivation layer by a first grounding structure and the lower isolation and passivation layer may be connected to the substrate by a further grounding structure, resulting in a grid of isolation and passivation layers and grounding structures. This may provide for a high mechanical stability, which may resist high mechanical strain.

According to another exemplary embodiment of the present invention, the first layer is a dielectric layer.

According to a further exemplary embodiment of the present invention, a semiconductor device with a supporting structure for supporting an isolation and passivation layer in the semiconductor device may be provided, the supporting structure comprising a first grounding structure adapted for connecting a first layer of the semiconductor device via a metal layer to a lower second layer of the semiconductor device.

This may provide for a mechanically stable semiconductor device with a long lifespan even in case of high temperature changes or otherwise induced mechanical forces.

According to another exemplary embodiment of the present invention, a method of supporting an isolation and passivation layer in a semiconductor device may be provided, the method comprising the step of providing a first grounding structure adapted for connecting a first layer of the semiconductor device via a metal layer to a lower second layer of the semiconductor device.

It is believed that the provision of grounding structures connecting different layers in the semiconductor device between which metal layers are arranged, may provide for a method of fabricating a device which has an improved mechanical stability with respect to temperature changes.

According to another exemplary embodiment of the present invention, the method comprises the step of intrinsically growing a thermal oxide of a substrate material of the semiconductor device directly on the substrate. After that, the oxide layer may be structured, for example with the help of an etching step, resulting in a plurality of single grounding structures.

This may provide for an easy to implement fabrication procedure.

It may be seen as the gist of an exemplary embodiment of the present invention, that isolation and passivation layers in a semiconductor device are connected by grounding structures in a region in which mechanical strain may be induced into the device. Therefore, the isolation and passivation layers may be mechanically coupled to each other and may be coupled to the substrate, resulting in a transfer of a mechanical strain into the substrate. This may increase the lifetime of the semiconductor device significantly.

These and other aspects of the present invention will become apparent from and elucidated with reference to the embodiments described hereinafter.

Exemplary embodiments of the present invention will be described in the following, with reference to the following drawings.

The illustration in the drawings is schematically. In different drawings, similar or identical elements may be provided with the same reference numerals.

Figure 1:
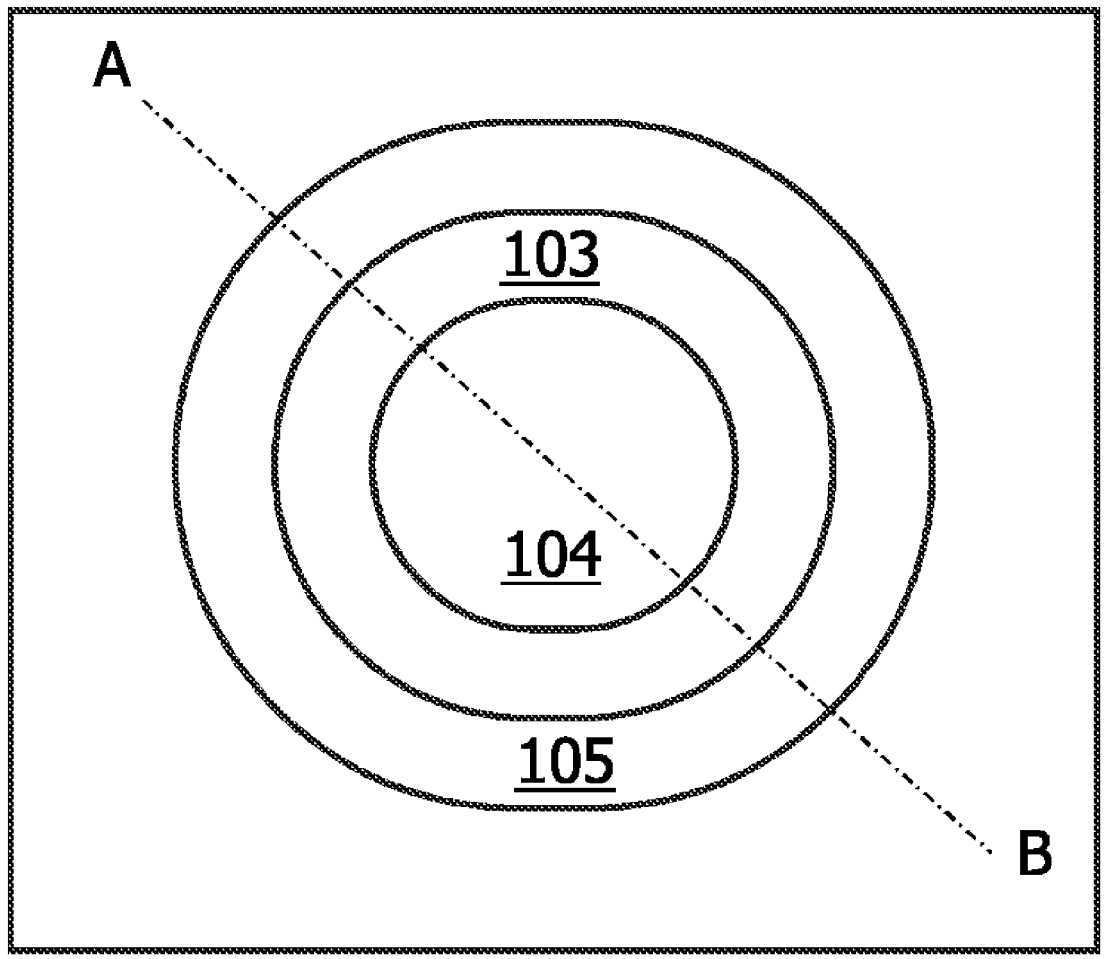
FIG. 1 shows a schematic representation of a top view of a via between two conductive metal layers.

FIG. 1 shows a schematic representation of a top view of a conduction or via connecting two conductive metal layers of a semiconductor device. Reference numeral 103 shows the upper metal layer. Below the upper metal layer 103 is an isolation and passivation layer 102 (depicted in FIG. 2) which is opened in section 104, resulting in a step of the metal layer 103 down to the lower metal layer 101 (depicted in FIG. 2). Further structuring of the top metallic layer 103 may yield to opening 105 in the metal layer 103. Since the opening 105 reaches down to the below lying isolation and passivation layer 102, a capping of the semiconductor device may induce shear forces and other mechanical stress directly into the isolation and passivation layer 102.

Semiconductor devices are often capped or provided with a casing during a final processing step, which may be a plastic casing or a casing of synthetic resin for providing protection against external effects, such as humidity or dirt. The upper side of the semiconductor crystal, which, for example, may comprise silicon or any other semiconducting substrate, such as, for example, germanium, gallium arsenide or gallium nitride, may support various structured layers. These structured layers usually comprise one or more electrically conductive layers (metal leads), for example consisting of aluminium, aluminium silicon, aluminium silicon copper or gold. Furthermore, a plurality of electric isolating and passivating layers may be provided.

As an example for these isolation and passivation layers silicon dioxide (which may be grown in a thermal process or which may be deposited onto the substrate), silicon nitrate and silicon oxynitride may be named.

Furthermore, the conductive layers comprise connecting surfaces, which will be electrically connected to the outer world, for example by means of so-called bond pads.

During assembly of the casing or during processing of the capping, the semiconductor (crystal or chip) is mounted to a carrier plate and electric leads are provided between the bond pads and the access ports (lead frame), for example by wire bonding. In the following, the chip may be sealed or moulded, resulting in a capping which for example comprises the synthetic resin with some filling or plastic. However, the capping, which is supposed to protect the inside semiconductor device against humidity or mechanical events or dirt, adheres to the thin layers and thus provides for a barrier against moisture and dirt between the environment and electrically active regions of the semiconductor device.

The completed semiconductor devices are subject to temperature changes, which may arise during normal operation or during a lifespan testing procedure. These temperature changes together with different temperature expansion coefficients of different materials in the semiconductor structure, the thin layers and the plastic mould may lead to significant mechanical strains. These mechanical strains may result in mechanical shear forces in the thin layers (passivation layers, isolation layers and conductive layers, the latter mostly comprising metals, or a one or multi-layer circuitry).

Due to the different expansion coefficients of the plastic capping and the layer material, the difference in thermal translations of the materials may increase from the middle of the semiconductor crystal to its edges. Thus, the resulting shear forces are maximal close to edges of the crystal. The shear forces may result in sideways translations of conductive leads (pattern shift) or even in electrical shortcuts between different active regions of a metallic layer. Furthermore, the shear forces may result in cracks in electrically isolating layers. These cracks may lead to short circuits between conductor paths arranged above each other due to metal which has infiltrated the cracks. Thus, the barrier against humidity and dirt (like sodium ions) may be destroyed.

The transfer of forces and strains from the plastic mould into the layer structure of the semiconductor device and therefore the chance of crack generation in the isolation and passivation layers may be even increased by an adhesion of the plastic mould onto the surface of an isolation and passivation layer 102. In general, the plastic mould adheres strongly onto the isolation and passivation layer 102 (in region 105), resulting in an effective transmission of shear or other mechanical forces from the capping layer down into the isolation and passivation layer 102. Therefore, a generation of cracks is likely.

Figure 2:
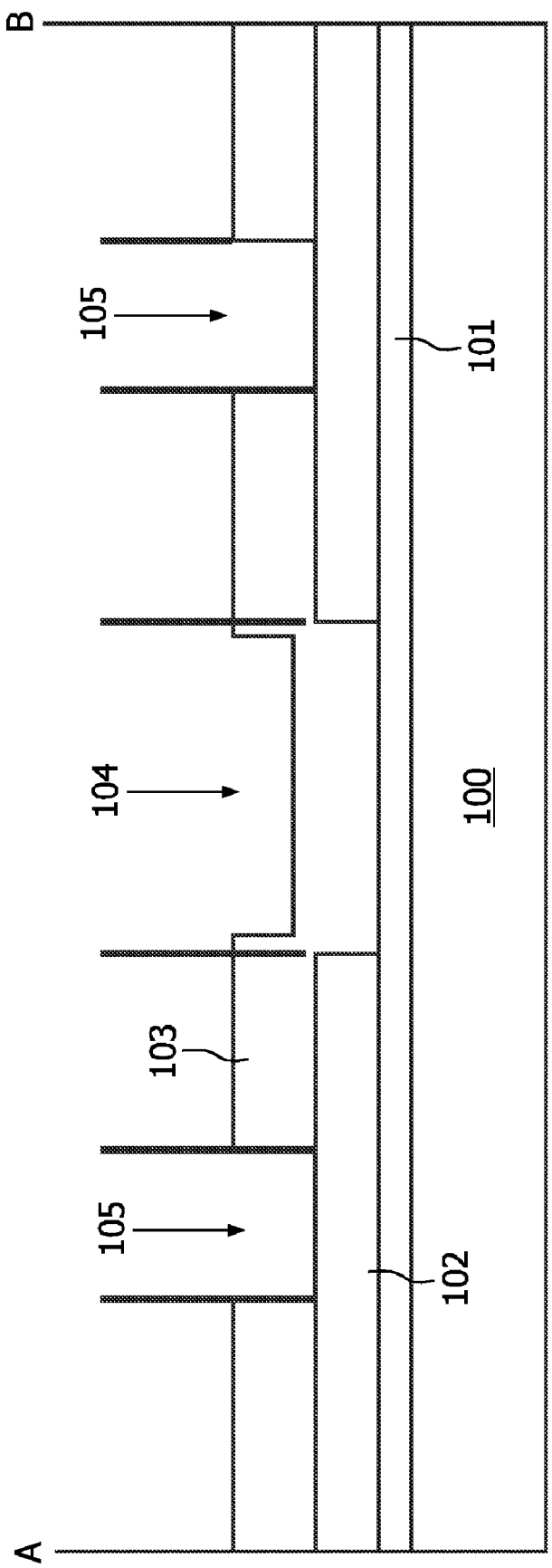
FIG. 2 shows a schematic representation of a cross section of the via depicted in FIG. 1 along line A-B.

FIG. 2 shows a cross sectional view of the via depicted in FIG. 1 along line A-B. The device comprises a semiconducting substrate 100 onto which a metal layer 101 is arranged. As a next layer an isolation and passivation layer 102 is provided which is opened in the region 104 down to the metal layer 101. A thickness of such an isolation and passivation layer 102 is in the range of 0.3-3 μm. A thickness of the metal layer 101 is in the range of 0.2-3 μm. On top of the isolation and passivation layer 102 is a second metal layer 103 which may have a thickness of around 0.2-5 μm. The upper metal layer 103 is isolated from the lower metal layer 101 by the isolation and passivation layer 102. But in the region 104, in which the isolation and passivation layer 102 is opened, the upper metal layer 103 has electrical contact with the lower metal layer 101.

As may be seen from FIG. 2, the isolation and passivation layer 102 has no mechanical connection to the substrate 100 in the region or close to the region of the opening 104. This is a typical weakness of such a structure, since shear forces or other mechanical forces may be able to generate cracks or other damages to the isolation layer 102. Furthermore, a further processing step may generate openings into the top metallic layer 103, such as openings 105. These openings 105 may result in mechanical contact between a capping layer (not depicted in FIG. 2) and the isolation and passivation layer 102, resulting in an efficient transmission of external forces from the capping layer into the isolation and passivation layer 102 (which may result in a damage of the layer 102).

In order to prevent such a damage of the isolation and passivation layer 102 and therefore in order to elongate the lifetime of the semiconductor device under varying thermal conditions, a supporting structure for supporting the isolation and passivation layers, according to an exemplary embodiment of the present invention, may be provided.

The different layers of the device as well as the plastic capping or moulding have significantly different expansion coefficients. Thus, during changes in temperature, which temperatures may vary between 100 to 150 degrees centigrade and −35 to −65 degrees centigrade, shear forces may be transmitted into the layer structure of the semiconductor device. Hard and brittle isolation and passivation layers may not be able to follow such changes in temperature without taking damage (due to their mechanical properties). This may result in a generation of cracks in the isolation and passivation layer. In case such a layer covers a metal layer or separates two metal layers from each other, this may result in a short circuit or other kind of system failure.

The sustainability of such a passivation layer 102 with respect to thermo mechanical stress in general may depend on various parameters, such as 1. the thermal expansion coefficient of the surrounding plastic capping. The bigger the thermal expansion coefficient of the surrounding plastic capping, the bigger may be the probability for creating a crack or other damage.
2. whether the border layer between plastic capping and layer structure of the device is an isolation and passivation layer or a metal layer. In case of a metal layer, the probability of generating a crack may be reduced.
3. the fraction between the thickness of a lower metal layer and an upper isolation and passivation layer. The thinner the metal layer and the thicker the isolation and passivation layer, the smaller may be the chance of generating a crack.
4. the lateral expansion of the metal layer under the isolation and passivation layer along a thermo mechanical force direction.

With respect to damages due to changes in temperature, the isolation and passivation layers which are located in proximity to metallized regions adapted for connecting the device to the outer world (such as the bond pads), or which are located in proximity to electrical connections between different metal layers (such as conductions or vias), may be particularly susceptible.

In those regions, the isolation and passivation layers may be opened in order to uncover the below metal layer or in order to connect different metal layers. Since in these regions, the isolation and passivation layers do not have a natural mechanical support, they may be easily destroyed by shear forces. Furthermore, the metal top layer may be structured in such a region, resulting in an uncovering of the below isolation and passivation layer. Thus, the plastic capping may mechanically or physically connect to the uncovered isolation and passivation layer 102. This may further increase the risk of crack building or other failure of the device.

In order to provide for a support of the isolation and passivation layers in a semiconductor device, a supporting structure may be used. This supporting structure may, according to an exemplary embodiment of the present invention, comprise a grounding structure 106 or even a plurality of grounding structures 106, 108, 109, 110, adapted for connecting a first isolation and passivation layer 102 (see FIG. 5) to a lower second isolation and passivation layer or to the substrate 100 (see FIG. 5).

The grounding structures 106, 108, 109, 110 may be mechanically hard and stable and may comprise a material such as thermal oxide, silicon dioxide, silicon nitride or titanium. The grounding structures 106, 108, 109, 110 may be arranged in an edge section of a metallic via, such as the one depicted in FIG. 3, for example along the direction of a thermal mechanical force and may connect the isolation and passivation layer 102 with the substrate or with a lower isolation and passivation layer.

Mechanically hard and stable means in this context, that a specific nanohardness of the grounding structures is significantly bigger than the hardness of a typical metal layer, such as aluminium, gold, or other conductive materials. For example, the hardness of the supporting structures is bigger than 1 GPa.

Each isolation and passivation layer is connected to the below lying isolation and passivation layer by respective grounding structures, until the substrate of the semiconductor device is reached. Thus, a grid consisting of a plurality of grounding structures and isolation and passivation layers may be provided, which is mechanically robust and may be able to transmit forces from the capping layer down into the substrate without damaging the layers.

Figure 4:
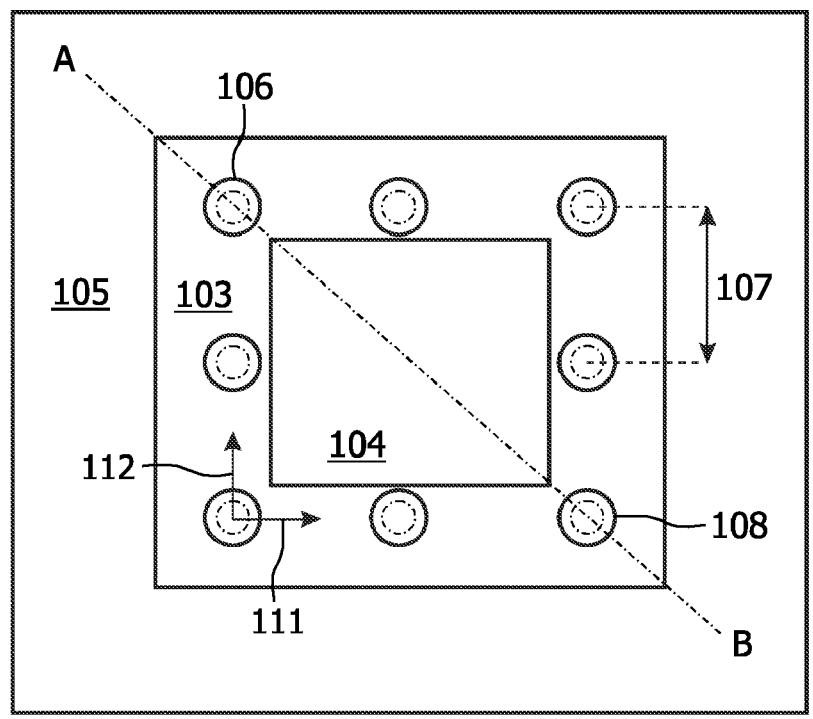
FIG. 4 shows another via with grounding structures according to another exemplary embodiment of the present invention.

FIG. 4 shows another exemplary embodiment of the present invention, in which eight grounding structures, such as grounding structures 106, 108, are arranged around a metallic via 104. Typical directions of shear forces are depicted by arrows 111 and 112, along which the grounding structures are arranged.

Figure 3:
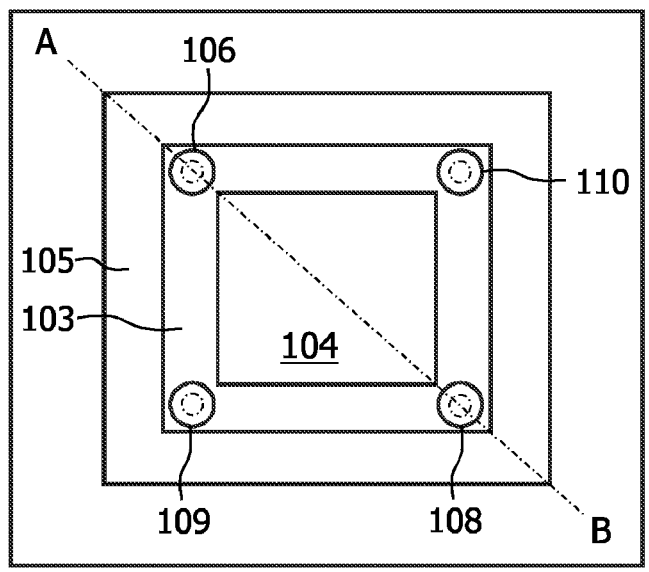
FIG. 3 shows a schematic representation of a top view of a via between two metal layers with grounding structures according to an exemplary embodiment of the present invention.
Figure 5:
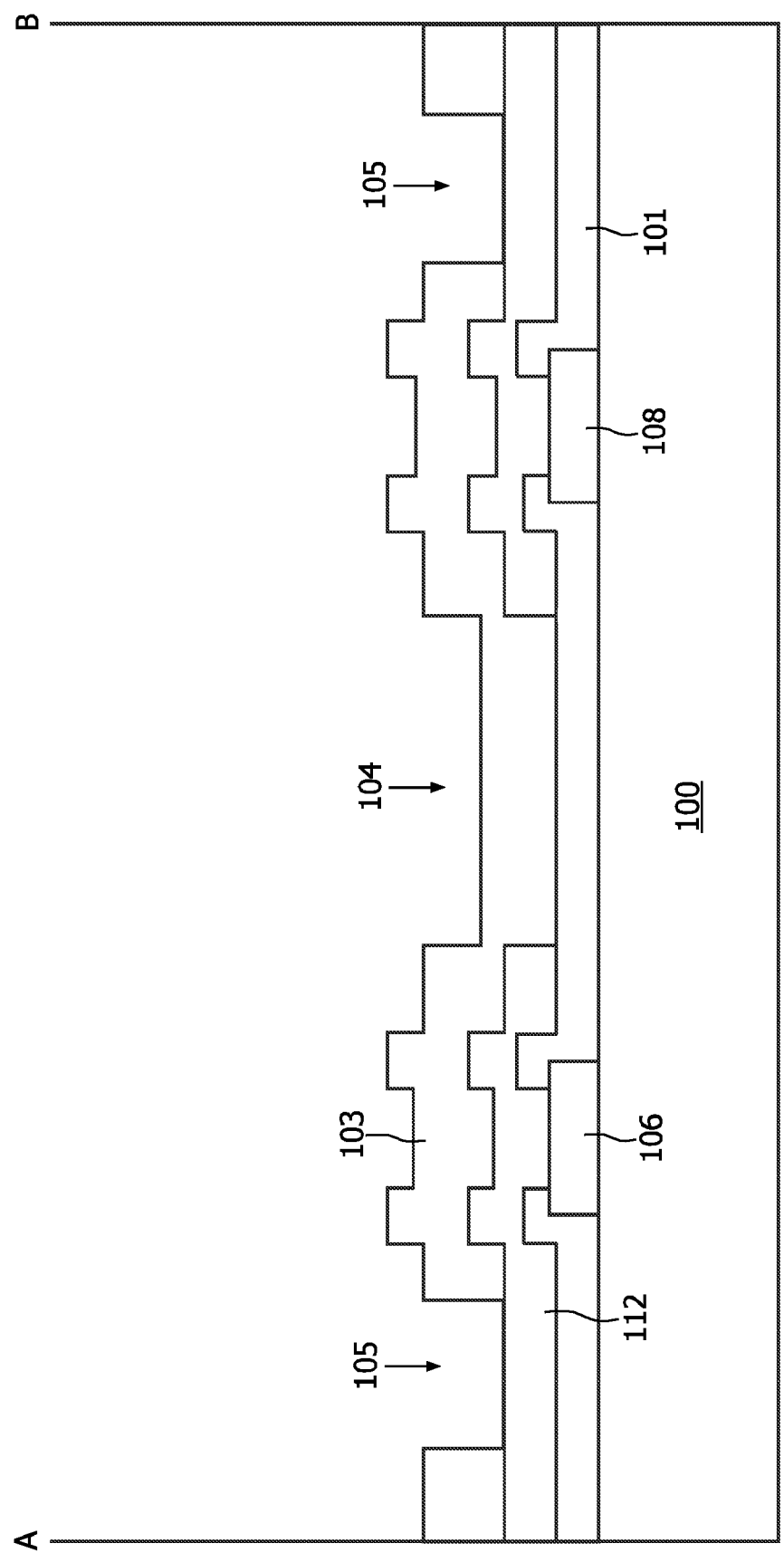
FIG. 5 shows a schematic representation of a cross section along line A-B of FIGS. 3 and 4.

FIG. 5 shows a schematic representation of a cross section along line A-B of FIGS. 3 and 4. As may be seen from FIG. 5, the isolation and passivation layer 102 comprises a window like opening 104 uncovering the below metal layer 101. On top of the isolation and passivation layer 102 a further metal layer 103 is provided, which electrically contacts the below metal layer 101 in the region of the opening 104. In the edge region of the opened section 104 (which is the via) are the above described grounding structures 106, 108, which are periodically arranged with a constant distance 107 from each other (see FIG. 4). However, it should be noted that a constant distance or a periodical arrangement of the grounding structures 106, 108 is not necessary but may ensure the conductivity of a metallic layer.

The grounding structures may have a diameter of around 0.1-20 μm and may be arranged in a distance of around 1-200 μm from each other. A periodical arrangement may provide for a supporting structure without interfering with the lateral conduction or even disable the lateral conduction.

For example, these grounding structures may have a height between around 0.1-2 μm.

Thus, a support may be provided to the isolation and passivation layers in the neighbourhood of vias or bond pads, resulting in a mechanical strengthening of the isolation and passivation layers. By providing a grid comprising the isolation and passivation layers and the grounding structures, a transmission of shear forces directly into the substrate may be provided, resulting in an absorption of the shear forces in the substrate. Thus, a mechanical support is provided, which absorbs introduced stress and reduces a lateral expansion or shift of the isolation and passivation layer above the metal layer 101.

As may be seen from FIG. 5, the grounding structures 106, 108 are arranged near the edge of the bond pad 104 and are connected to the isolation and passivation layer 102, thereby supporting the isolation and passivation layer 102. Furthermore, the grounding structures 106, 108 are connected to the semiconducting substrate 100, which may be an active region of the semiconducting material.

According to an exemplary embodiment of the present invention, the grounding structures are grown from the semiconducting substrate 100 intrinsically by a thermal oxidization of the substrate material, followed by a structuring of the thermal grown oxide layer, for example by selective etching.

The present invention may be used in the field of semiconductor devices which are provided with a capping or housing of plastic or synthetic resin, which material has a different temperature expansion coefficient than the semiconductor material. The semiconductor devices may be, for example, integrated circuits or discrete semiconductors such as small signal or power transistors. By reducing the transfer of mechanical energy and shear forces into the layer system of the semiconductor device, the lifetime stability of the device may be improved.

Thus, according to an aspect of the present invention, the mechanical stability of isolation and passivation layers may be increased intrinsically, without extrinsically changing the structure or assembly of the isolation and passivation layers (for example by using double layer structures) and without changing the structure of the device itself (for example by using metal capping layers).

Since, according to an aspect of the present invention, no metal capping layer has to be used, no structuring of that capping layer has to be performed (since there is no metallic capping layer), which would otherwise result in a revealing of the below isolation and passivation layer. Thus, the risk of introducing strain into the layer may be significantly reduced.

Due to the easy processing of the grounding structure, the supporting structure according to the present invention may be easily be used in combination with a wafer coating, chip coating, double layer isolations, or ductile protection rings in order to further increase the thermal mechanical lifetime of the device.

Since the present invention allows for a usage of high-stress mould compounds for capping or sealing of the device, the processing costs of the device may be reduced, since the curing rate of high-stress mould compounds may be much higher than the curing rate of low-stress mould compounds, resulting in a faster processing.

It should be noted that the term "comprising" does not exclude other elements or steps and the "a" or "an" does not exclude a plurality and that a single processor or system may fulfill the functions of several means or units recited in the claims. Also elements described in association with different embodiments may be combined.

It should also be noted, that any reference signs in the claims shall not be construed as limiting the scope of claims.

The invention claimed is:

1. Supporting structure for supporting an isolation and passivation layer in a semiconductor device, the supporting structure comprising:
   a first grounding structure adapted for connecting a first layer of the semi-conductor device via a metal layer to a lower second layer of the semiconductor device.

2. The supporting structure of claim 1,
   wherein the first layer is a first isolation and passivation layer; and
   wherein the second layer is one of a second isolation and passivation layer and a substrate.

3. The supporting structure of claim 1,
   wherein the first grounding structure comprises a material with a first hardness;
   wherein the metal layer comprises a material with a second hardness; and
   wherein the first hardness is significantly bigger than the second hardness.

4. The supporting structure of claim 1,
   wherein the first grounding structure is mechanically hard and stable and comprises a material selected from the group consisting of thermal oxide, silicon dioxide, silicon nitride, and titanium.

5. The supporting structure of claim 1,
   wherein the semiconductor device comprises at least one of a metallic via and a bond pad; and
   wherein the first grounding structure is arranged in an edge section of the metallic via or in an edge section of the bond pad.

6. The supporting structure of claim 1,
   further comprising a second grounding structure adapted for connecting the first layer of the semiconductor device via the metal layer to the lower second layer of the semiconductor device;
   wherein the first grounding structure and the second grounding structure are arranged along a direction of a thermo mechanical strain induced by a plastic moulding on top of the device.

7. The supporting structure of claim 6,
   further comprising a third grounding structure adapted for connecting one of the first layer and the second layer to a lower third layer of the semiconductor device;
   wherein the third layer of the semiconductor device is part of a substrate.

8. The supporting structure of claim 1,
   wherein the first layer is a dielectric layer.

9. Semiconductor device with a supporting structure for supporting an isolation and passivation layer in the semiconductor device, the supporting structure comprising:
   a first grounding structure adapted for connecting a first layer of the semiconductor device via a metal layer to a lower second layer of the semiconductor device.

10. The semiconductor device of claim 9,
    wherein the first layer is a first isolation and passivation layer; and
    wherein the second layer is one of a second isolation and passivation layer and a substrate.

11. Method of supporting an isolation and passivation layer in a semiconductor device, the method comprising the step of:
    providing a first grounding structure adapted for connecting a first layer of the semiconductor device via a metal layer to a lower second layer of the semiconductor device.

12. The method of claim 11,
wherein the first layer is a first isolation and passivation layer; and
wherein the second layer is one of a second isolation and passivation layer and a substrate.

13. The method of claim 11,
wherein the provision of the first grounding structure comprises the step of:
intrinsically growing, on the substrate, a thermal oxide of a substrate material of the semiconductor device.

14. The method of claim 13,
wherein growing of the thermal oxide is performed by thermal oxidizing a surface of the substrate, resulting in an oxide layer; and
structuring the oxide layer, resulting in a plurality of single grounding structures.

15. The method of claim 14,
wherein structuring of the oxide layer comprises an etching step.

16. The method of claim 14,
wherein the single grounding structures are arranged along an edge section of a metallic via or an edge section of a bond pad.

17. The method of claim 14,
wherein the single grounding structures are arranged along a direction of a thermo mechanical strain.

18. The method of claim 14,
wherein the single grounding structures are arranged in a periodical manner.

19. The method of claim 12,
further comprising the step of providing a third grounding structure adapted for connecting one of the first layer and the second layer to a lower third layer of the semiconductor device;
wherein the third layer of the semiconductor device is part of the substrate.

* * * * *